United States Patent [19]

Lai

[11] 4,302,529

[45] Nov. 24, 1981

[54] PROCESS FOR DEVELOPING A POSITIVE ELECTRON RESIST

[75] Inventor: Juey H. Lai, Burnsville, Minn.

[73] Assignee: Honeywell Inc., Minneapolis, Minn.

[21] Appl. No.: 110,295

[22] Filed: Jan. 8, 1980

[51] Int. Cl.³ .................................................. G03C 5/24
[52] U.S. Cl. ........................................ 430/296; 430/313; 430/325; 430/435; 430/436; 427/431; 427/273; 134/38
[58] Field of Search ............... 430/296, 325, 435, 436, 430/447; 427/431, 273

[56] References Cited

U.S. PATENT DOCUMENTS

| | | | |
|---|---|---|---|
| 3,914,462 | 10/1975 | Morisnita et al. | 427/273 X |
| 3,935,332 | 1/1976 | Poliniak et al. | 430/296 X |
| 4,011,351 | 3/1977 | Gipstein et al. | 430/296 |
| 4,096,290 | 6/1978 | Fredericks | 427/273 X |

OTHER PUBLICATIONS

Lai et al., *Journal of the Vacuum Society Technology,* 16(6), Nov./Dec. 1979.

*Primary Examiner*—John D. Welsh
*Attorney, Agent, or Firm*—Charles G. Mersereau

[57] ABSTRACT

A method of developing a positive electron resist for delineating a desired integrated circuit pattern upon a circuit substrate is disclosed for a positive resist consisting of a copolymer film of poly (methyl alpha-chloroacrylate-co-methacrylonitrile) utilizing a developer selected from the group consisting of benzonitrile, a mixture of benzonitrile and methyl cellosolve, and a mixture of benzonitrile and methyl ethyl ketone.

16 Claims, No Drawings

PROCESS FOR DEVELOPING A POSITIVE ELECTRON RESIST

The invention herein described was made in the course of or under a contract, or subcontract thereunder with the Department of the Army.

CROSS REFERENCE TO CO-PENDING APPLICATIONS

Reference is made to a co-pending U.S. application Ser. No. 152,261, filed May 22, 1980, by J. N. Helbert and Charles U. Pittman, Jr., for "Method of Delineating a Desired Integrated Circuit Pattern upon a Circuit Substrate" and assigned to the Department of the Army. That application is concerned with a method of forming a desired integrated circuit pattern on a circuit substrate using the copolymer poly (methyl alpha-chloroacrylate-comethacrylonitrile) as a positive electron resist. The present application, on the other hand, is concerned with a particular improved process for developing the resist film.

This application is also copending with U.S. Patent Application Ser. No. 051,263, filed June 22, 1979 by J. N. Helbert for "Method of Patterning a Substrate" and assigned to the Department of the Army.

BACKGROUND OF THE INVENTION

1 Field of the Invention

The present invention relates generally to a process for developing a positive electron-beam sensitive resist film. More particularly, it relates to a process for developing a resist of a copolymer of methacrylonitrile and methyl alpha-chloroacrylate. The resist after being exposed in an electron beam and developed by the process disclosed, produces a vertical resist profile suitable for use in high resolution submicron dimension electron beam lithography.

2. Description of the Prior Art

The application of electron beam techniques to the art of semiconductor fabrication has enabled great strides to be made in reducing the minimum line width and thus the size of a pattern which can successfully be manufactured. This has been accomplished both through progress in the technology involved with the perfection in the precision of the electron beam system itself and in the progress which has been made in the technology concerned with the pattern defining medium or resist material.

In electron beam microfabrication, a substrate, which may be, for example, silicon dioxide, silicon, glass or chromium plated glass, is further coated with a layer of polymer resist material and the resist is patterned by changing the solubility of the polymer with an electron beam. Subsequently, the mask is "developed" by dissolving away the unwanted area of polymer utilizing a suitable solvent material and the resultant pattern is used as a mask either for plating, chemical etching, ion etching or ion implantation. This electron-beam lithography (EBL) is an integrated circuit production technique which utilizes a polymer resist to delineate circuit patterns for monolithic circuits.

When polymers of the required type are irradiated with an electron beam, the molecular structure is affected such that some of the polymer molecules are excited or ionized by the beam. This excitation causes some of the resist molecules to cross link with other molecules in the polymer structure and others to degrade or undergo scission. The predominant manner in which such a polymeric material reacts to exposure to an electron beam has led electron resists to be classified into two main categories. Thus, a polymer which becomes predominantly gelled or crosslinked, and thereby decreases its solubility after irradiation, is termed a negative resist. Conversely, if the scission process predominates and the solubility of the polymer increases after irradiation, it is called a positive resist. The resist to be developed by the process of the present invention is a positive resist.

A suitable electron resist must have various physical and chemical properties which allow it to fulfill the requirements for electron beam fabrication. The polymer material involved must be sensitive to an electron current of a fairly low value or the resist sensitivity itself will be the limiting factor on the writing speed and line width which can be achieved. The resist medium must be capable of a high resolution or resist contrast compatible with that achieved in writing and etching techniques utilizing the high resolution capability available with electron beam technology. The resist must also have the ability to adhere satisfactory to a variety of substrates used in different microfabricated applications. The medium also must be able to withstand normally acid, base, and ion etching processes and should not be sensitive to small daily process variabilities.

Poly (methyl methacrylate) (PMMA) has been the standard positive e-beam resist material. It is capable of high resolution but is not sensitive enough for commercial device production using direct-write e-beam lithography. The e-beam sensitivity of PMMA is $1.1 \times 10^{-4}$ Coulombs per $cm^2$, while sensitivities in the $10^{-5}$ to $10^{-6}$ range are desirable for EBL production; resolution, however, cannot be sacrificed for sensitivity. Resolution is stipulated by the minimum obtainable line width and line space for the resist. In this connection, PMMA is capable of resolving 1 micron lines and spaces.

SUMMARY OF THE INVENTION

Electron beam lithography (EBL) has attained a much greater degree of resist sensitivity without sacrificing the high resolution of PMMA. When properly developed, poly (methyl alpha-chloroacrylate-comethacrylonitrile) (MCA/MCN) copolymers have been found to be highly sensitive as positive action e-beam resists. These copolymers are prepared by emulsion polymerization techniques. The copolymer is then dissolved in a spinning solvent that will dissolve the copolymer and form a viscous solution. The solution is then applied to the surface of the substrate and the substrate spun to form a smooth, uniform resist film of at least 3,000 angstroms in thickness. The resist film is heated and the region of the resist film to be patterned then exposed to ionizing radiation until exposures greater than $2.0 \times 10^{-5}$ $C/cm^2$ are obtained.

The development of resist patterns is one of the most critical steps in electron beam lithography. Proper choice of developers and development process can enhance the sensitivity and minimize the swelling of the resist. Selection of a developer is particularly critical for producing a vertical resist profile which is required for precise control of submicron dimension. By means of the present invention, the exposed regions of the resist can be developed to the substrate in a manner which allows the resulting integrated circuit pattern to achieve the desired sensitivity and resolution. According to the present invention, the exposed resist regions of the film are selectively removed to the substrate by a timed spray development in benzonitrile or mixtures of benzonitrile with methyl cellosolve or methyl ethyl ketone. Of these, the use of 1:1 benzonitrile/methyl cellosolve mixture is preferred.

DESCRIPTION OF THE PREFERRED EMBODIMENT

Example 1

A 1:1 MCA/MCN copolymer is prepared in the following manner. An aqueous stock solution of $5 \times 10^{-2}$ gram of potassium persulfate, 0.4 gram of sodium lauryl sulfate and 100 grams of distilled water is premixed. Then, a mixture of 23 grams of methyl alpha-chloroacrylate and 27 grams of methacrylonitrile is added and the reaction heated at 50° C. with vigorous magnetic stirring for 14 hours under a slow continuous nitrogen purge. The resulting copolymer latex is coagulated by pouring into rapidly stirring methanol. Upon evaporation of the methanol, a powder of the copolymer results.

A viscous solution of 1:1 MCA/MCN copolymer is prepared by dissolving the powder into nitromethane. The resulting solution is filtered to 0.6 micron by standard membrane filtering techniques and the filtrate applied to a silicon substrate having an oxide coating of about 0.5 micron. The substrate is spun using conventional spinning equipment to obtain films ranging from 0.30 to 0.70 micron for spinning frequencies ranging from 1000 to 4000 rpm. After spinning, the resist film is heated in-vacuo at 160° C. for 30 minutes. The resist film on the substrate to be patterned is then exposed to an electron beam test pattern generated by a computer-controlled electron beam pattern generator operating at 15 KeV until exposures greater than $2.0 \times 10^{-5}$ C/cm$^2$ are obtained.

At this point, the exposed resist is ready for the very important development step. The exposed resist regions of the 0.70 micron thick film are then selectively removed to the substrate. The atmosphere of the exposed resist film is purged by nitrogen for 2 minutes followed by an 80-second spray development in a 1:1 mixture of benzonitrile and methyl cellosolve.

No loss in the unexposed resist area occurs during development. The exposed area of the resist is 4 to 5 times more sensitive than PMMA while maintaining line edge wall profile verticality. In addition, the 1:1 MCA/MCN copolymer has a 2 times better plasma (CF$_4$/O$_2$) etch resistance than PMMA, whose resistance is marginal.

Example 2

The 1:1 copolymer as prepared in Example 1 is dissolved in nitromethane to give a 3.0 w/v% viscous solution. The resulting solution is filtered to 0.6 micron by membrane filtering techniques and the filtrate applied to a glass plate substrate coated with a layer of chromium of 0.07 micron in thickness. The substrate is then spun at frequencies from 700 to 2000 rpm to yield films ranging from 0.70 to 1.30 microns in thickness. After spinning, the resist is heated to 160° C. for 30 minutes in-vacuo. The resist film on the substrate to be patterned is then exposed to an electron beam team pattern generated by a computer-controlled electron beam pattern generator operating at 15 KeV until exposures greater than $2.1 \times 10^{-5}$ C/cm$^2$ are obtained.

The exposed resist regions of the 0.70 micron thick film are purged in N$_2$ for 2 minutes then selectively removed to the substrate by a 4-minute spray development in a 1:9 mixture of benzonitrile and methyl ethyl ketone.

No measurable loss in the unexposed resist area occurs during development. The exposed area of the resist is 4 times more sensitive than PMMA while maintaining satisfactory line edge acuity.

Example 3

A 2.3:1 MCA/MCN copolymer is prepared as described in Example 1 except that the monomer charges are altered. The resulting 2.3:1 copolymer is dissolved into a solvent mixture of 7:3 acetonitrile and nitromethane to yield a 2.0 w/v% solution. This solution is applied to a silicon substrate coated with an oxide layer of 0.5 micron in thickness and spun at frequencies of 700 to 4000 rpm to yield resist films ranging from 0.28–1.0 micron. After spinning, the resist film is heated in-vacuo at 160° C. for 30 minutes. The resist film on the substrate to be patterned is then exposed to an electron beam test pattern generated by a computer-controlled electron beam pattern generator operating at 15 KeV until exposures greater than $2.4 \times 10^{-5}$ C/cm$^2$ are obtained. The exposed resist images in the 0.70 micron thick resist film are then selectively removed to the substrate after a 2-minute N$_2$ purge by a 2-minute spray development in benzonitrile (or 3:1 benzonitrile/methyl cellosolve mixture). No measurable loss in the unexposed resist area occurs during development.

It should be noted in regard to the preparation of the resist that the spinning solvent for the MCA/MCN copolymer must dissolve a high enough concentration of copolymer to result in a viscous solution that can be applied as a smooth uniform resist film of about 0.3 to 1.0 micron in thickness. The use of nitromethane as the spinning solvent has been very successful. Another spinning solvent that can be used is a solvent mixture of 7:3 acetonitrile and nitromethane. Films ranging from 0.28 micron to 1.30 microns can be cast using 2 to 3 percent solutions of MCA/MCN copolymer in nitromethane. A particularly desirable range of spinning frequencies is 1000 to 4000 rpm. As the substrate, one can use any material on which circuit patterns are delineated.

A variety of substrate materials can be used. These include silicon wafers with 0.1 to 0.5 micron of conventional grown oxide, or chrome coated glass. Thus, Cr(700 Å) coated glass and silicon SiO$_2$ (5000 Å) coated have been successfully used. When the Cr coated glass are used, the developed resist film is further immersed in a citric ammonium nitrate-acetate acid solution to etch Cr lines. The developed patterns are then examined under optical or scanning electron microscopes. SiO$_2$ are plasma cleaned (O$_2$, 1.5 torr, 300 W, 10 minutes) and baked at 700° C. in N$_2$ for 30 minutes before being coated with resists. In some cases, SiO$_2$ wafers have been further fractured to examine the line edge profile of the resist patterns.

After the resist film has been applied to the substrate, the resist film may be heated to improve the adhesion of the resist to the substrate. The region of the resist film to be patterned is then exposed to ionizing radiation, as for example to an electron beam test pattern generated by a flying spot scan-controlled electron beam operating at 15 KeV until exposures greater than $2.0 \times 10^{-5}$ C/cm$^2$ are obtained. The ionizing radiation may also be X-ray.

To evaluate plasma etching resistance of the resists, the resists are exposed to a pre-selected etch gas. The etch gas selected has been 96 percent $CF_4$+4 percent $O_2$ which has often been used to etch $SiO_2$. The etch rates of the resists are established by measuring the resist film thickness before and after etching. The plasma etching conditions which have been used are 150 watts, 0.5 torr, 20 minutes, and the plasma reactor is an IPC 4005 plasma system obtained from International Plasma Corporation, Hayward, California. Since residual gases remaining inside the plasma reactor may affect the etch rate from run to run, PMMA (Ev 2041) was used to compare the etch rate of the resists.

To compare the sensitivity of the resists with that of PMMA, e-beam exposure on Ev 2041 (High molecular weight PMMA obtained from E. I. DuPont Corporation, Wilmington, Delaware) has also been carried out using the same exposure test patterns. The sensitivity of PMMA (Ev 2041) is $8.0 \times 10^{-5}$ Ccm$^{-2}$ using the criteria of no unexposed resist thickness loss. However, the initial resist film thickness of Ev 2041 was 0.60 $\mu$m instead of 0.70 $\mu$m used for the others. The sensitivity of PMMA, therefore, is $8\text{-}9 \times 10^{-5}$ Ccm$^{-2}$ which is about a factor of 4-5 less sensitive than the polymers of Examples 1-3.

As previously stated the success of a polymer resist in its use in electron-beam lithography is highly dependent on the developer. The use of benzonitrile or mixtures of benzonitrile and methyl cellosolve or methyl ethyl ketone has yielded superior usable images from the MCA/MCN copolymer in accordance with the present invention It should be noted in regard to the spraying times utilizes in the development process of the invention that some variation in the times can be tolerated without any detrimental effect on the development results. The actual optimum time required will vary with film thickness, exact composition, and other considerations quite familiar to those skilled in the art.

It should also be noted that the proportional composition of the developing solution may be varied from those of Examples 1-3 to optimize development of a particular resist composition and film thickness. Thus, as the ratio of MCA/MCN is varied in the copolymer, the ratio of components in the developer may also change to produce the optimum results.

It will be readily understood that the copolymer resists developed in accordance with the present invention function with the same resolution as PMMA and PMCN but with greater sensitivity. Hence, lower IC production costs are achieved when the copolymers are used as direct write e-beam positive resists. The copolymers also serve as plasma-etching masks, as well or better than PMMA.

The embodiments of the invention in which an exclusive property or right is claimed are defined as follows:

1. A method of developing a positive electron resist for delineating a desired integrated circuit pattern upon a circuit substrate wherein said positive resist is a copolymer film of poly (methyl alpha-chloroacrylate-comethacrylonitrile) having a thickness of about 0.3 to 1.0 microns and which has been exposed to sufficient ionizing radiation comprising the step of developing the exposed regions of the resist film to the substrate by means of a developer selected from the group consisting of benzonitrile, a mixture of benzonitrile and methyl cellosolve, and a mixture of benzonitrile and methyl ethyl ketone.

2. The method according to claim 1 wherein the exposed regions of the resist are developed to the substrate in a 1 to 1 mixture of benzonitrile and methyl cellosolve.

3. The method according to claim 1 wherein the exposed regions of the resist are developed to the substrate in a 3 to 1 mixture of benzonitrile and methyl cellosolve.

4. The method according to claim 1 wherein the exposed regions of the resist are developed to the substrate in a 1 to 9 mixture of benzonitrile and methyl ethyl ketone.

5. The method according to claim 1 wherein the exposed regions of the resist are developed to the subrate in benzonitrile.

6. The method of claim 1 further comprising the step of purging the atmosphere environment of said resist with a gas inert to said resist and said developer prior to applying said developer.

7. The method of claim 3 wherein said inert gas is Nitrogen.

8. The method of claim 1 wherein said developer is applied as a spray.

9. The method of claim 1 further comprising the step of rinsing said developer from said resist.

10. The method of claim 9 wherein said solvent is 2-propanol.

11. The method of claim 9, further comprising the step of drying the rinsed film with a gas inert to said resist.

12. The method of claim 11 wherein said gas is nitrogen.

13. A method of developing a positive electron resist for delineating a desired integrated circuit pattern upon a circuit substrate wherein said positive resist is a copolymer film of poly (methyl alpha-chloroacrylate-comethacrylonitrile) having a thickness of about 0.3 to 1.0 microns and which has been exposed to sufficient ionizing radiation comprising the steps of:
purging the atmosphere of said resist with a gas inert to said resist and the developer;
applying a developing spray to said resist, said spray containing a developer selected from the group consisting of benzonitrile, a mixture of benzonitrile and methyl cellosolve, and a mixture of benzonitrile and methyl ethyl ketone;
rinsing said developer from said resist; and
drying said resist film with a gas inert to said film.

14. The method of claim 13 wherein said developer is a 1:1 mixture of benzonitrile and methyl cellosolve and said spray is applied for about 80 seconds.

15. The method of claim 13 wherein said developer is a 1:9 mixture of benzonitrile and methyl ethyl ketone and wherein said spray is applied for about 4 minutes.

16. The method of claim 13 wherein said developer is a 3:1 mixture of benzonitrile and methyl cellosolve and wherein said spray is applied for about 2 minutes.

* * * * *